United States Patent
Labelle et al.

(10) Patent No.: US 6,746,973 B1
(45) Date of Patent: Jun. 8, 2004

(54) EFFECT OF SUBSTRATE SURFACE TREATMENT ON 193 NM RESIST PROCESSING

(75) Inventors: Catherine B. Labelle, San Jose, CA (US); Ernesto Gallardo, Stockton, CA (US); Ramkumar Subramanian, Sunnyvale, CA (US); Jacques Bertrand, Capitola, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/212,985

(22) Filed: Aug. 5, 2002

(51) Int. Cl.[7] .................. H01L 21/302; H01L 21/461
(52) U.S. Cl. .................. 438/948; 438/694; 438/724; 438/725
(58) Field of Search .................. 438/778, 779, 438/780, 781, 798, 948, 949, 724, 725, 744, 894, 723; 430/311, 313, 314, 317

(56) References Cited

U.S. PATENT DOCUMENTS

| | | | |
|---|---|---|---|
| 6,103,457 A | 8/2000 | Gabriel | 430/318 |
| 2001/0045646 A1 * | 11/2001 | Shields et al. | 257/734 |
| 2003/0045008 A1 * | 3/2003 | Olsen et al. | 438/7 |

FOREIGN PATENT DOCUMENTS

| | | | |
|---|---|---|---|
| JP | 10186672 | * | 7/1998 |

* cited by examiner

*Primary Examiner*—Jack Chen
*Assistant Examiner*—Thanhha Pham
(74) *Attorney, Agent, or Firm*—Amin & Turocy, LLP

(57) ABSTRACT

One aspect of the present invention relates to a system and method for mitigating surface abnormalities on a semiconductor structure. The method involves exposing the layer to a first plasma treatment in order to mitigate surface interactions between the layer and a subsequently formed photoresist without substantially etching the layer, the first plasma comprising oxygen and nitrogen; forming a patterned photoresist over the treated layer, the patterned photoresist being formed using 193 nm or lower radiation; and etching the treated layer through openings of the patterned photoresist. The system and method also includes a monitor processor for determining whether the plasma treatment has been administered and for adjusting the plasma treatment components. The monitor processor transmits a pulse, receives a reflected pulse response and analyzes the response. An optional second plasma treatment comprising nitrogen and hydrogen may be administered after the first plasma treatment but before forming the photoresist.

29 Claims, 6 Drawing Sheets

EFFECT OF SUBSTRATE SURFACE TREATMENT ON 193 NM RESIST PROCESSING

TECHNICAL FIELD

The present invention generally relates to processing a semiconductor substrate. In particular, the present invention relates to treating a surface of a virgin silicon oxynitride layer with an oxygen-nitrogen plasma to facilitate a reduction in line edge roughness and surface interaction with respect to subsequent 193 nm and below photoresist processing.

BACKGROUND ART

Achieving the objectives of miniaturization and higher packing densities continue to drive the semiconductor manufacturing industry toward improving semiconductor processing in every aspect of the fabrication process. Several factors and variables are involved in the fabrication process. For example, at least one and typically more than one photolithography process may be employed during the fabrication of a semiconductor device. Each factor and variable implemented during fabrication must be considered and improved in order to achieve the higher packing densities and smaller, more precisely formed semiconductor structures.

In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, X-rays, or an electron beam) illuminates selected areas of the surface through an intervening master template, the photoresist mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photoresist mask causes a chemical transformation in the exposed areas of the coating thereby making the image area either more or less soluble (depending on the coating) in a particular solvent developer. The more soluble areas are removed in the developing process to leave the pattern image in the coating as less soluble polymer. The resulting pattern image in the coating, or layer, may be at least one portion of a semiconductor device that contributes to the overall structure and function of the device.

Because the photoresist is used to form features on the semiconductor devices, the integrity of the photoresist must be maintained throughout the lithography process. That is, any flaw or structural defect which is present on the photoresist may be indelibly transferred to underlying layers during a subsequent etch process wherein the photoresist is employed. However, protecting the integrity of the photoresist layer may not always prevent the formation of flawed or defective semiconductor features on the wafer. Various other layers or attributes of the wafer may be the cause of undesirable structural defects.

One example of an undesirable structural defect is line-edge roughness (LER), as seen on a wafer 10 in Prior Art FIG. 1. LER refers to surface variations and irregularities particularly on the sidewalls of a feature, but also on the top and bottom perimeters of the feature. LER may originate with the photoresist layer which can be caused by various factors such as LER on chrome patterns residing on the reticle, image contrast in a system for generating the photoresist pattern, a plasma etch process which can be used to pattern the photoresist, natural properties of the photoresist materials, and the photoresist processing method.

In addition, LER on a semiconductor feature can result from the radiation used to process a photoresist formed over an underlying layer. For example, thinner photoresist layers are typically utilized when forming smaller features having higher resolution. Thus, shorter wavelength radiation from 193 nm and lower is employed to process these photoresists. However, photoresists processed with the shorter wavelength radiation experience damaging surface interactions with the underlying layer. That is, when irradiated with 193 nm and lower radiation, the surface of the photoresist interacts with the surface of the underlying layer causing LER to occur on the developed photoresist.

As the fabrication trend of semiconductors relies heavily on producing more miniaturized and more densely packed wafers, the use of photoresists using 193 nm and below radiation is substantially increasing in order to meet the demands of the industry. Undesirable surface interactions between the photoresist and the underlying layer appear to be more serious for 193 nm photoresists, which have less etch resistance than resists used at higher wavelengths such as 248 nm, 365 nm, etc. Because the photoresist material is relatively soft and thin when irradiated at this desired wavelength, the radiation used to pattern the photoresist may undesirably affect the underlying layer. The condition may even worsen for wavelengths below 193 nm, such as 157 nm photoresists. Moreover, LER can interfere with accurate metrology and adversely affect device performance.

With respect to FIG. 1, for example, forming 300 nm pitch trenches 20 in a photoresist layer 30 overlying a silicon oxynitride 40 and a substrate 50 using 193 nm photoresist processing results in substantial LER 60 on the surfaces of the trenches. In addition, signs of undesirable surface interaction may be observed on the top surface 70 of the layer. Conventional resolutions to these problems involve forming an undoped oxide cap after the layer is formed but before photoresist deposition and processing begins. However, the occurrences of the surface abnormalities and poor feature profiles persist despite the oxide cap.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides a novel system and method for mitigating the occurrence of surface abnormalities on etched semiconductor features caused by undesirable surface interaction between a surface of a layer and the photoresist formed thereon during a lithography process. More specifically, the present invention provides a system and method for reducing line edge roughness (LER) as it may occur on the surface of about 193 nm or lower photoresists overlying a silicon oxynitride or silicon nitride layer. This aspect of the present invention is accomplished in part by applying a plasma treatment onto the surface of the layer before a photoresist is formed thereon. In addition, the present invention is accomplished in part by employing a monitoring device to oversee the plasma treatment and to determine whether the plasma treatment has been effective.

For example, a virgin silicon oxynitride layer may undergo a plasma treatment before a photoresist is formed thereon and patterned. The layer may be exposed to a first plasma containing oxygen and nitrogen followed by an optional second plasma containing nitrogen and hydrogen. The surface of the silicon oxynitride layer is treated with the first plasma in order protect it from undesirable effects caused by short wavelength photoresist processing. Examples of undesirable effects include surface interaction between the surface of the silicon oxynitride layer and the photoresist layer, resulting in LER on the developed photoresist layer. The LER on the developed photoresist layer may be transferred to the underlying silicon oxynitride layer, thereby interfering with device formation and performance.

The first plasma treatment containing oxygen and nitrogen is not employed under conventional etch process conditions. Therefore, the plasma treatment does not substantially etch, remove, or damage in any way any portion of the exposed silicon oxynitride layer or any other layer that may be exposed to the treatment. The first plasma treatment modifies the surface of the silicon oxynitride layer in such a manner to prevent unwanted surface interaction arising from subsequent short wavelength photoresist processing. After the short wavelength photoresist is patterned, conventional etchants employed under etch process conditions may be utilized to selectively remove exposed portions of the silicon oxynitride layer as desired. Furthermore, a monitor processor may be employed during the fabrication process to determine whether the plasma treatment has been administered, to adjust plasma treatment components as needed and to provide feedback information to a fabrication process and/or system as it relates to the status of the modified layer.

One aspect of the present invention relates to a method for mitigating surface abnormalities on a semiconductor structure. The method involves providing a semiconductor substrate having a layer formed thereon; exposing the layer to a plasma treatment in order to mitigate surface interactions between the layer and a subsequently formed photoresist without substantially etching the layer, the plasma containing oxygen and nitrogen; forming a patterned photoresist layer over the treated layer; and etching the treated layer through one or more openings in the patterned photoresist layer.

Another aspect of the present invention relates to a method for mitigating surface abnormalities in situ on a semiconductor structure. The method involves providing a semiconductor substrate having a virgin silicon oxynitride layer deposited thereon; exposing the silicon oxynitride layer to a plasma treatment in order to mitigate surface interactions between the silicon oxynitride layer and a subsequently formed photoresist without substantially etching the silicon oxynitride layer, the plasma containing oxygen and nitrogen; determining whether the silicon oxynitride layer has been treated by employing a monitor processor; forming a patterned photoresist layer over the treated silicon oxynitride layer; and etching the treated silicon oxynitride layer through openings of the patterned photoresist layer to form a semiconductor feature.

Yet another aspect of the present invention relates to a system for mitigating LER in situ during fabrication of a semiconductor structure. The system includes a layer containing silicon oxynitride, the layer being contained within a chamber and being exposed to a plasma treatment, which is selective to the layer and which does not act as an etchant; a plasma chamber for treating the layer with the plasma treatment; one or more plasma treatment components operatively coupled to the plasma treatment for administering the plasma treatment; and a monitor processor operatively connected to the chamber and the wafer for controlling the plasma treatment and for determining whether the layer has been protected against surface abnormalities.

DISCLOSURE OF INVENTION

Figure 1:
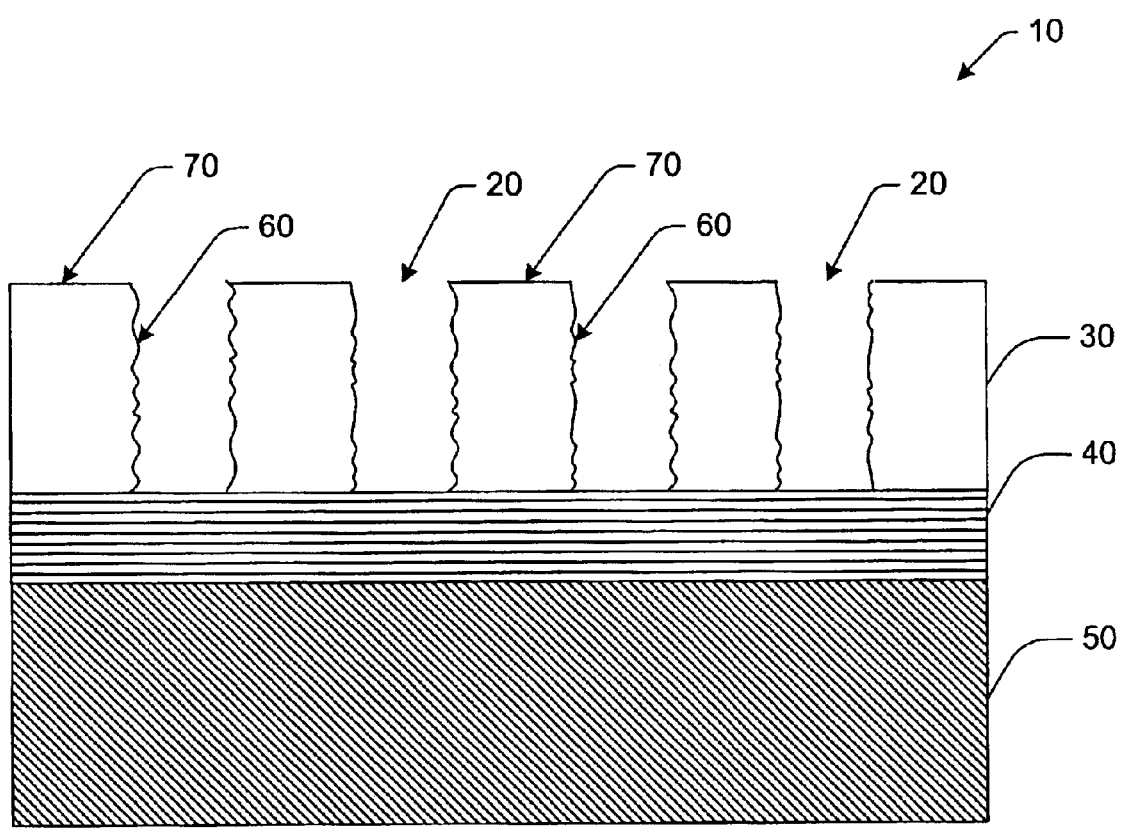
FIG. 1 illustrates a schematic cross-section of a partially fabricated semiconductor device in accordance with the prior art.

The present invention involves a system and method for mitigating surface abnormalities on semiconductor devices, and on developed photoresists in particular, by exposing a virgin, or unprocessed, surface before a photoresist is formed thereon with a plasma. More specifically, the present invention facilitates reducing the occurrence of line edge roughness (LER) caused by damaging surface interactions between a surface of a 193 nm or lower photoresist and a surface of an underlying layer. Treating the underlying layer (or exposed layer of material) before a 193 nm or lower photoresist is formed over or directly on top of the treated layer substantially reduces, if not eliminates, the undesirable interactions between the surfaces of the photoresist and the layer which causes LER formation on the developed photoresist. Because this surface interaction is minimized or eliminated, the photoresist can be irradiated with short wavelength radiation from 193 nm and lower and developed. As a result, the developed 193 nm or lower photoresist is substantially free of LER.

The present invention is particularly applicable to virgin silicon oxynitride and silicon nitride layer surfaces where a photoresist is patterned thereon using short wavelength radiation which herein means about 193 nm or lower wavelength radiation. A virgin surface is a surface which has not been processed or exposed to an etchant, any other substance, or radiation. It should be understood that other types of layer materials are contemplated and are intended to fall within the scope of the present invention. Short wavelength radiation specifically includes about 193 nm light and about 157 nm light.

Mitigating the occurrence of LER and/or surface interactions (e.g., between the surface of the layer to be etched and the surface of the photoresist used to etch the layer) on semiconductor devices may be accomplished in part by exposing a virgin silicon oxynitride or silicon nitride layer to a first plasma treatment containing oxygen ($O_2$) and nitrogen ($N_2$). An optional second plasma treatment containing nitrogen ($N_2$) and hydrogen ($H_2$) may follow the first plasma treatment. The first plasma treatment is administered under non-etch process conditions which means that it merely modifies the virgin layer at least at its surface in order to protect it from undesirable short wavelength photoresist processing effects such as LER. In particular, the first plasma treatment alters or hardens the surface of the layer without substantially etching, removing or damaging any portion of the layer or any other layer exposed to the first plasma. Furthermore, structural features are not destroyed or damaged in any way by the first plasma treatment.

Following the first plasma treatment, a short wavelength photoresist may be formed over the layer and patterned. In particular, the short wavelength photoresist is selectively irradiated with about 193 nm or lower wavelength radiation and either the irradiated or non-irradiated portions are removed using a developer, thereby exposing a portion of the treated layer. Exposed portions of the treated layer may be etched through openings in the short wavelength photoresist using suitable etchants under suitable etch process conditions. Because the layer is treated with the oxygen-nitrogen plasma, the photoresist layer which is subsequently formed thereon is protected from interacting with the surface of the (treated) layer during the short wavelength processing. Consequently, the developed photoresist is substantially free of surface abnormalities such as LER. Likewise, the features etched in the treated layer can be substantially free of surface abnormalities as well. Moreover, feature profiles are substantially improved. Examples of features include vias, trenches, dual damascene structures, and the like.

Because the plasma treatment reduces the amount or degree of surface interaction between the short wavelength photoresist and the layer, the top surfaces of the photoresist, and thus the treated layer, are also substantially free of surface abnormalities such as ridges, roughness, and the like.

The first plasma contains a sufficient amount of oxygen and nitrogen to mitigate the occurrence of LER and/or surface interactions between a photoresist and an underlying layer. In one embodiment, the first plasma contains from about 94% to about 97% oxygen by volume and from about 3% to about 6% nitrogen by volume. In another embodiment, the first plasma contains from about 95% to about 96% oxygen by volume and from about 4% to about 5% nitrogen by volume. In some instances, the first plasma may contain additional components, so long as the plasma continues to mitigate the occurrence of LER and/or surface interactions between the treated layer and an overlying photoresist layer. In yet another embodiment, the first plasma consists essentially of oxygen and nitrogen.

The first plasma treatment may be followed by an optional second plasma treatment. The second plasma contains a sufficient amount of nitrogen and hydrogen to further mitigate the occurrence of LER and/or surface interactions. In one embodiment, the second plasma contains from about 94% to about 98% nitrogen by volume and from about 2% to about 6% hydrogen by volume. In another embodiment, the second plasma contains from about 95% to about 97% nitrogen by volume and from about 3% to about 5% hydrogen by volume. In some instances, the second plasma may contain additional components, so long as the plasma continues to mitigate the occurrence of LER and/or surface interactions between the treated layer and an overlying photoresist layer. In yet another embodiment, the second plasma consists essentially of nitrogen and hydrogen.

The first and second plasma treatments may be administered at a flow rate suitable to mitigate the occurrence of LER and/or surface interactions. In one embodiment, the first plasma treatment includes an oxygen flow rate from about 1500 sccm to about 2500 sccm and nitrogen flow rate from about 50 sccm to about 150 sccm. In another embodiment, the oxygen flow rate is from about 1750 sccm to about 2250 sccm and the nitrogen flow rate is from 75 sccm to about 125 sccm. In yet another embodiment, the oxygen flow rate is from about 1900 to about 2100 sccm and the nitrogen flow rate is from about 95 sccm to about 105 sccm.

The optional second plasma treatment containing nitrogen and hydrogen has a flow rate from about 1800 sccm to about 3000 sccm. In another embodiment, the optional second plasma flow rate is from about 2100 sccm to about 2700 sccm. In yet another embodiment, the optional second plasma flow rates is from about 2300 sccm to about 2550 sccm.

In addition, the first and second plasma treatments may be administered under a pressure to mitigate the occurrence of LER and/or surface interactions between the treated layer and an overlying photoresist layer undergoing processing and development. In one embodiment, the first and optional second plasma pressures are independently selected from about 600 mTorr to about 1800 mTorr. In another embodiment, the first and optional second plasma pressures are independently selected from about 950 mTorr to about 1550 mTorr. In yet another embodiment, the first and optional second plasma pressures are independently selected from about 1050 mTorr to about 1350 mTorr.

The temperature employed during the first and second plasma treatments may be any suitable temperature to mitigate the occurrence of LER and/or surface interactions. In particular, during the first and optional second plasma treatments, the temperature in the treatment chamber can be set and/or regulated such that the wafer or substrate temperature is maintained from about 100° C. to about 300° C.

The first and second plasma treatments may be administered for a time sufficient to mitigate the occurrence of LER and/or surface interactions. In one embodiment, the duration of the first plasma treatment is from about 100 to about 200 seconds; and the duration of the optional second plasma treatment is from about 10 seconds to about 35 seconds. In another embodiment, the duration of the first plasma treatment is from about 125 seconds to about 225 seconds; and the duration of the optional second plasma treatment is from about 15 seconds to about 30 seconds. In yet another embodiment, the duration of the first plasma treatment is from about 145 seconds to about 175 seconds; and the duration of the optional second plasma treatment is from about 18 seconds to about 25 seconds.

Other process conditions may also be employed and are contemplated to fall within the scope of the present invention.

According to another aspect of the present invention, a monitor processor can be utilized to control the first plasma treatment and to determine whether a layer of material has been treated with the oxygen-nitrogen plasma before a short wavelength photoresist layer is formed and developed thereon. In particular, the monitor processor may be operatively connected to a plasma treatment chamber, a plasma treatment complex, plasma treatment components and to an output device. The monitor processor is located such that it may transmit pulses (e.g., at least one pulse) to and receive reflected pulse responses (e.g., at least one reflected pulse) from the layer of material. The transmitted and reflected pulses may be in the form of light at a suitable wavelength and/or sound at a suitable frequency to carry out the present invention. The transmitted pulse and reflected pulse activity may be recorded by the monitor processor or some other data recorder internal or external to the monitor processor. Because the plasma treatment transforms at least the surface of the layer of material in some manner, a reflected pulse response from a treated layer exhibits a different appearance than a reflected pulse response from a non-treated layer. Thus, a user or programmed machine can differentiate between an oxygen-nitrogen treated layer and a non-treated layer by observing and analyzing the reflected pulse responses.

In addition, the monitor processor operates to signal the plasma treatment to apply another treatment to the layer either under the same treatment parameters as the prior treatment or under amended parameters (e.g., flow rate of plasma, pressure, temperature, duration), adjustments to which can be controlled and implemented by the monitor processor. Likewise, the monitor processor can also terminate subsequent plasma treatments when it determines that the layer has been treated and therefore be moved on to the next stage in the fabrication process. Furthermore, the monitor processor provides feedback information to a fabrication process and/or system as it relates to the current status (e.g., layer: not treated, treated; first plasma treatment: completed, not completed; and the like) of the layer. This allows the fabrication process or system to prepare for upcoming processing steps and to make process or system adjustments based on the current status of the layer.

The plasma treatment complex may also instruct and/or control the plasma treatment components in order to activate or terminate the components depending on instructions and/or information provided by the monitor processor.

Once the layer has been treated, it can proceed to the next phase of fabrication where it may receive a short wavelength photoresist layer. The short wavelength photoresist may have a thickness from about 3000 angstroms to about 4500 angstroms. The photoresist is subsequently irradiated using 193 nm or lower radiation and developed accordingly to provide a patterned photoresist where portions of the plasma treated layer are exposed through the openings. Because the underlying layer was treated with the first and optional second plasma treatments, substantially no interaction occurred between the treated layer and the photoresist layer. Therefore, the features formed on the developed photoresist are substantially free of LER.

During a subsequent etch process of the treated layer, selected portions of the treated layer may be exposed to an etchant through openings of the developed photoresist layer in order to transfer the semiconductor feature(s) onto the layer. Because the developed photoresist is substantially free of LER, the features transferred to the layer can also be substantially free of LER. Hence, the plasma treatment of the layer does not preclude the effectiveness and efficiency of conventional etchants.

The present invention may be further described with respect to a silicon oxynitride layer undergoing a semiconductor process to form trenches having, for example, a 300 nm pitch using a short wavelength photoresist layer formed over the silicon oxynitride layer, wherein the photoresist layer is patterned by 193 nm or lower radiation for enhanced resolution of the feature, as illustrated in FIGS. 2–7 below.

Figure 2:
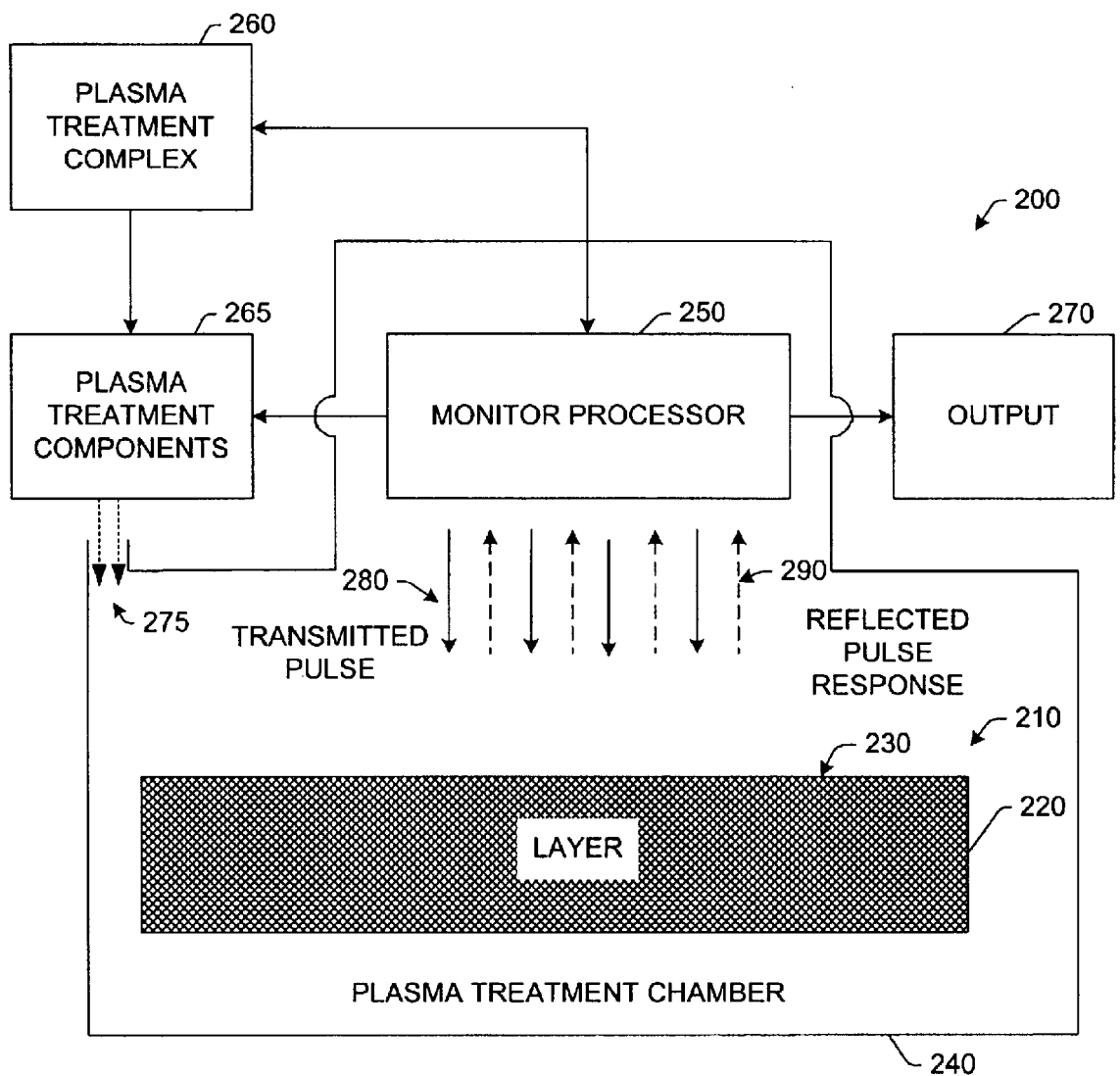
FIG. 2 illustrates a high-level, schematic block diagram of a semiconductor structure in accordance with another aspect of the present invention.

FIG. 2 illustrates a high-level, schematic block diagram of a system 200 for mitigating the occurrence of LER during fabrication of a semiconductor device. The system 200 includes a semiconductor structure 210. The semiconductor structure 210 contains a silicon oxynitride layer 220. The layer 220, which also has an exposed top surface 230, may be described as a virgin layer 220 since it has not been subjected to any form of processing. Alternatively, the structure 210 may contain a silicon nitride layer.

The semiconductor structure 210 may be housed within a plasma treatment chamber 240 in preparation of exposure to a first plasma treatment 275. The first plasma treatment contains about 95% oxygen by volume and about 5% nitrogen by volume. The first plasma treatment 275 is administered at an oxygen flow rate of about 2000 sccm, a nitrogen flow rate of about 100 sccm and under a pressure of about 1200 mTorr for about 150 seconds. Any suitable temperature may be employed to mitigate the occurrence of LER and/or surface abnormalities, such that the temperature of the structure 210 is maintained from about 100° C. to about 300° C.

An optional second plasma treatment (not shown) containing about 96% nitrogen by volume and about 4% hydrogen by volume may be administered after the first plasma treatment and before forming a patterned photoresist thereon at process conditions similar to the first plasma treatment. For example, the optional second plasma may be administered at a combined flow rate of about 2500 sccm and under a pressure of about 1200 mTorr. The second plasma treatment may be about a 20 second process and at any temperature suitable to mitigate the occurrence of LER and/or surface abnormalities.

The plasma treatment chamber 240 may be an integral part of a main processing chamber used during semiconductor processing or it may be an independent station placed within a semiconductor processing apparatus, such that in either configuration, the chamber 240 may be employed in situ with respect to the semiconductor fabrication process.

The system 200 also includes a monitor processor 250 operatively connected to a plasma treatment complex 260, plasma treatment components 265, and an output device 270. The monitor processor 250 facilitates reducing LER on the structure 210, and particularly on the surface 230 of a subsequently formed photoresist layer (not shown), by determining whether the layer 220 has undergone the first plasma treatment 275. In particular, the monitor processor 250 transmits a pulse 280 (e.g., light at a suitable wavelength as indicated by solid line arrows) onto the exposed surface 230 of the layer 220. This can occur before, during, and after the plasma treatment 275 has been administered. The monitor processor 250 can also receive a reflected pulse response 290 (e.g., broken line arrows) from the layer 220. The transmitted and reflected pulses may be one or more transmitted or reflected pulses, respectively. Reflected pulse responses 290 received prior to the plasma treatment 275 may provide a base level of the layer 220 to which reflected pulse responses 290 received during and after the treatment 275 may be compared.

The monitor processor 250 may perform a pulse comparison between the pulse transmissions 280 and the reflected pulse responses 290 to determine whether the layer 220 has been affected by the first plasma treatment 275 and whether the first plasma treatment 275 has been administered. Data or numeric values may be set within and by the monitor processor 250 to indicate whether the layer 220, and particularly the surface 230 of the layer 220, has been affected by the treatment. For example, the monitor processor 250 may collect and analyze the transmitted and reflected pulses and then provide a determination in the form of a "yes/no" indicator.

The monitor processor 250 may perform in concert with the plasma treatment complex 260 as well as independently from the complex 260. For example, the monitor processor 250 can communicate information including data and instructions relating to the pulse transmissions 280 and responses 290 to the plasma treatment complex 260. Instructions may correspond to adjustments to the one or more plasma treatment components 265 for subsequent treatments. In this respect, the plasma treatment complex 260 receives the information and then implements the appropriate instructions and adjusts the one or more plasma treatment components 265 accordingly. The monitor processor 250 may also instruct the plasma treatment complex 260 to administer another treatment 275 to the same layer 220. Thus, the monitor processor 250 performs together with the plasma treatment complex 260.

Alternatively, the monitor processor 250 can control the one or more plasma treatment components 265 independently and without the plasma treatment complex 260. That is, the monitor processor 250 may bypass the plasma treatment complex 260 and communicate information including adjustments and data directly to the plasma treatment components 265. This provides flexibility to the system 200 according to the needs and demands of the user. The one or more plasma treatment components 265 correspond to plasma flow rate, pressure, temperature, duration of treatment, and the like.

The monitor processor 250 may also provide feedback information to the fabrication process and/or system 200 as it relates to the current status of the layer 220. This facilitates preparation of subsequent processes in terms of making adjustments to the subsequent processes according to the current status of the layer 220. The current status of the layer may be indicated as "layer: not treated" or "layer: treated" and "first plasma treatment: completed" or "first plasma treatment: not completed". The current status may also include measurements relating to the layer 220 which have been collected and analyzed by the monitor processor 250. Such measurements may be extrapolated by the fabrication process or system 200 to signal the monitor processor 250, the treatment complex 260, and/or the plasma treatment components 265 to repeat the previous plasma treatment for the layer 220, to discard and reform the layer 220, or to repeat the plasma treatment under modified conditions. Therefore, the fabrication process or system 200 may communicate with the monitor processor 250, the plasma treatment complex 260, and/or the plasma treatment components 265.

The structure 210 may proceed to further processing when the monitor processor 250 has determined that the surface 230 of the layer 220 has been properly treated with at least the first plasma treatment. For example, a photoresist layer (not shown) may be formed over the layer 220 and patterned using 193 nm or lower wavelength radiation, thereby exposing portions of the layer 220. Moreover, removal of the exposed portions of the layer 220 in order to form a feature may result in substantially reduced LER on the feature surfaces and thus, improved feature profiles.

Finally, the output device 270 may display and/or record information regarding the plasma treatment 275 and monitor processor 250. For example, data relating to the plasma parameters, type of plasma, pulse transmissions 280 and reflected pulse responses 290 may be recorded for later use and further analysis and/or displayed as the results are communicated (in real time) in any usable format.

Figure 3:
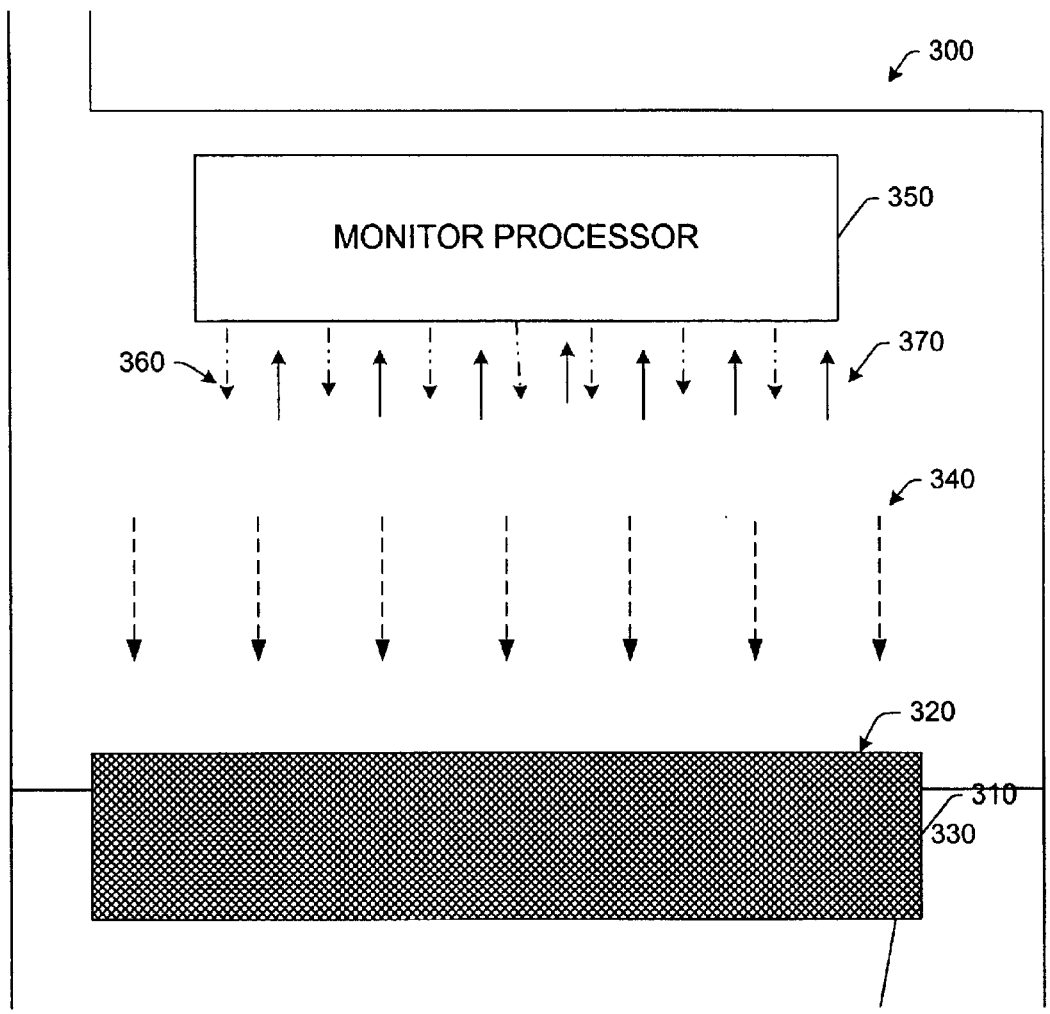
FIG. 3 illustrates a schematic cross-section of a semiconductor structure in accordance with another aspect of the present invention.

Turning now to FIG. 3, a schematic, cross-sectional view of a portion of a system 300 for mitigating surface abnormalities and in particular, LER, in accordance with one aspect of the present invention is illustrated. The system 300 includes a silicon oxynitride layer 310 which has a top surface 320 that is exposed in preparation for a first plasma treatment 340. Alternatively, selected portions of the silicon oxynitride layer 310 may be exposed in preparation for the first plasma treatment 340 depending on the desired application. It should also be understood that one or more layers may be formed beneath the silicon oxynitride layer 310.

The silicon oxynitride layer 310 is located within a chamber 330. The chamber 330 can be a main chamber for fabrication processing or a specific chamber designated for the first plasma treatment 340. The first plasma treatment 340 in FIG. 3 is performed under non-etch process conditions. This means that the exposed silicon oxynitride layer 310 as well as any other layer which may be exposed to the first plasma treatment 340 is not substantially etched, partially or completely removed, or damaged in any way.

For example, at least a portion of the surface 320 of the silicon oxynitride layer 310 is exposed to the first plasma treatment 340 for about 125 to about 175 seconds, or about 150 seconds, in order to cause a chemical change to at least the surface 320 of the silicon oxynitride layer 310. The chemical change to at least the surface of the silicon oxynitride layer is sufficient to mitigate and/or prevent interaction between the silicon oxynitride layer surface and an overlying photoresist layer which is to undergo 193 nm or lower photoresist processing in subsequent processing steps. However, the chemical change to at least the surface of the silicon oxynitride layer 310 is not sufficient to materially preclude or inhibit further etch processing of the silicon oxynitride layer 310.

The first plasma treatment 340 contains oxygen and nitrogen in varying amounts as described herein and above. The treatment 340 is administered under a pressure of about 900 mTorr to about 1500 mTorr, or about 1200 mTorr and at an oxygen flow rate from about 1500 sccm to about 2500 sccm, or about 2000 sccm and a nitrogen flow rate from about 70 sccm to about 125 sccm, or about 100 sccm. The temperature suitable for the first plasma treatment 340 is any temperature which facilitates mitigating LER and/or surface interactions and which maintains the temperature of the silicon oxynitride layer 310 (wafer structure) from about 100° C. to about 300° C. An optional second plasma treatment (not shown) containing nitrogen and hydrogen under process conditions previously discussed may follow the first plasma treatment according to the desired application. Furthermore, other plasma treatment parameters are possible in order to modify the layer for protection from undesirable surface abnormalities caused by 193 nm and lower photoresist processing.

The system 300 employs a monitor processor 350 before, during, and after the first plasma treatment is administered in order to determine whether the silicon oxynitride layer 310 has been affected by the first plasma treatment 340 as desired. The monitor processor 350 may be located within or external to the chamber 330 depending on what type of chamber is used to conduct the first plasma treatment 340. However, regardless of the configuration, the first plasma treatment as well as the monitoring may be performed in situ an on-going semiconductor fabrication process.

At scheduled or random intervals of time, the monitor processor 350 transmits one or more pulses 360 of light and/or sound onto the surface 320 of the layer 310. The monitor processor 350 also receives one or more reflected pulse responses 370 from the surface 320 of the layer 310. The pulse transmissions 360 and responses 370 are analyzed and compared with data collected just prior to the administering of the treatment. Since the surface 320 of the layer 310 is modified or hardened to a degree by the treatment 340, the reflected pulse responses are measurably different from the reflected pulse responses collected from the non-treated layer 310. Thus, the user can easily discern whether the treatment has occurred and whether the surface 320 of the silicon oxynitride layer 310 has been affected by such treatment.

Figure 4:
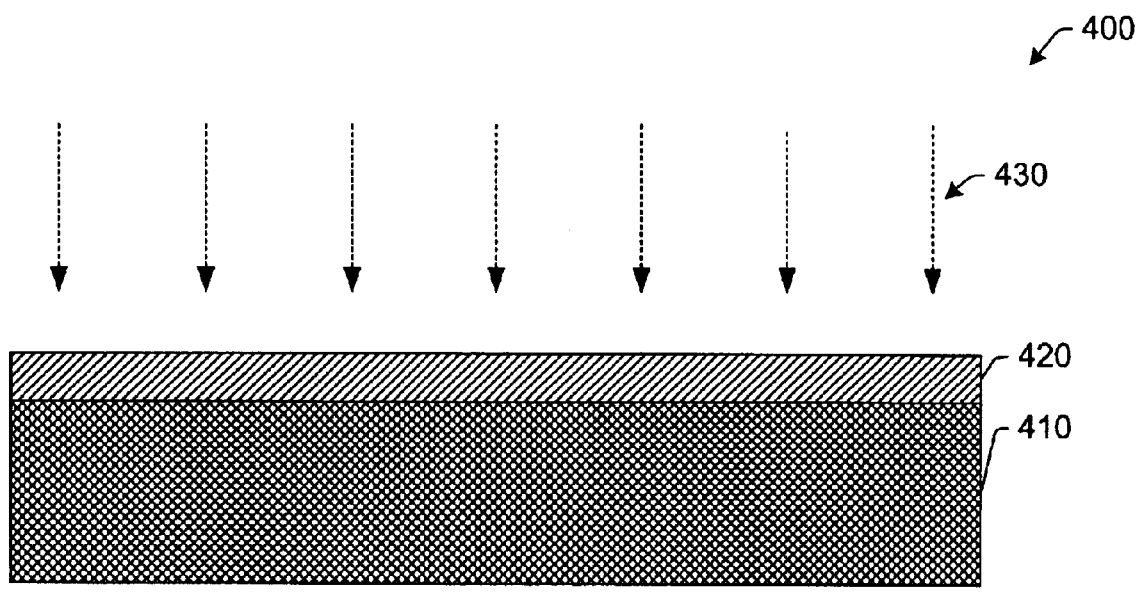
FIG. 4 illustrates a schematic cross-section of a semiconductor structure in accordance with an aspect of the present invention.

FIG. 4 illustrates a schematic, cross-sectional view of a semiconductor structure 400 in accordance with one aspect of the present invention. Following a first plasma treatment of the silicon oxynitride layer 410, as described with respect to the system 300 in FIG. 3, an ultra-thin photoresist layer 420 having a thickness from about 3500 angstroms to about 4000 angstroms may be deposited thereon. It should be appreciated that the photoresist layer 420 is formed on at least a portion of the silicon oxynitride layer 410. An image corresponding to a semiconductor feature, such as a trench pattern, is transferred to the photoresist layer 420 using no greater than 193 nm (e.g., about 157 nm and lower) wavelength radiation as indicated by the dashed line arrows 430. Because the silicon oxynitride layer 410 was treated prior to the formation of the photoresist 420 thereon, surface interaction between the two layers is minimized. Consequently, the patterned photoresist is substantially free of LER, as seen and described later in FIGS. 5 and 6.

Figure 5:
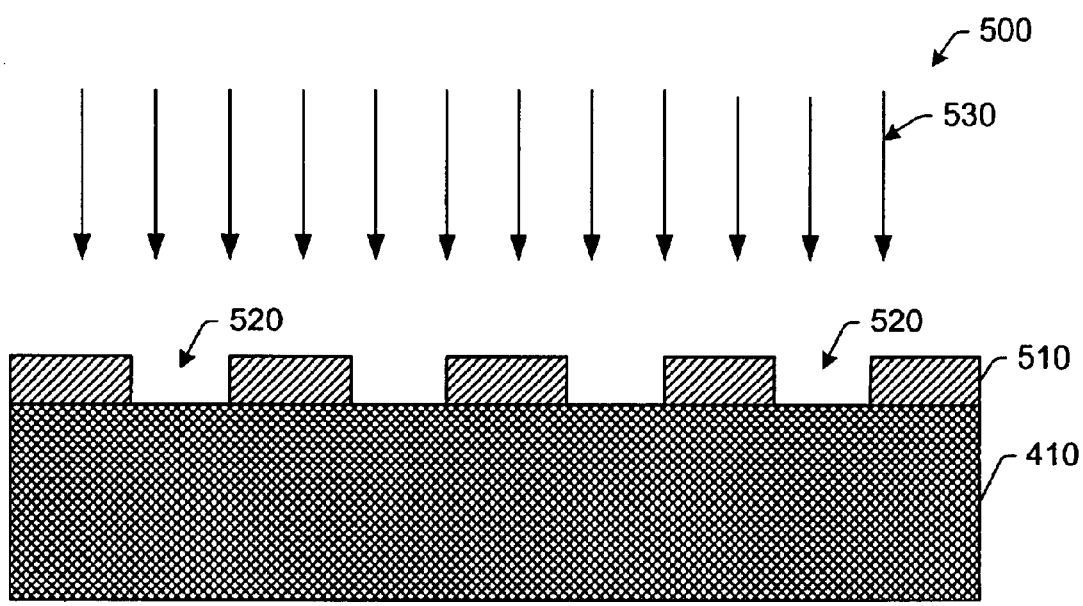
FIG. 5 illustrates a schematic cross-section of a semiconductor structure in accordance with another aspect of the present invention.

In FIG. 5, a schematic, cross-sectional view of a semiconductor structure 500 is shown in accordance with another aspect of the present invention. The structure 500 includes the treated silicon oxynitride layer 410 as described in FIG. 4 above. The structure also includes a patterned ultra-thin photoresist layer 510 having a thickness from about 3700 angstroms to about 3900 angstroms. The patterned photoresist layer 510 has one or more trenches 520 formed therein by using 193 nm or lower wavelength radiation. The exposed portions of the treated silicon oxynitride layer 410 may be etched 530 through the openings 520 of the photoresist 510. The openings 520 in the photoresist correspond to the trench pattern 520 previously patterned in the photoresist layer 510. According to the present invention, the trench pattern 520 does not exhibit surface abnormalities such as LER due to the treated underlying silicon oxynitride layer 410. Any etchants employed during the etch process may be used under conventional etch process conditions in order to selectively remove the exposed portions of the silicon oxynitride layer 410.

Figure 6:
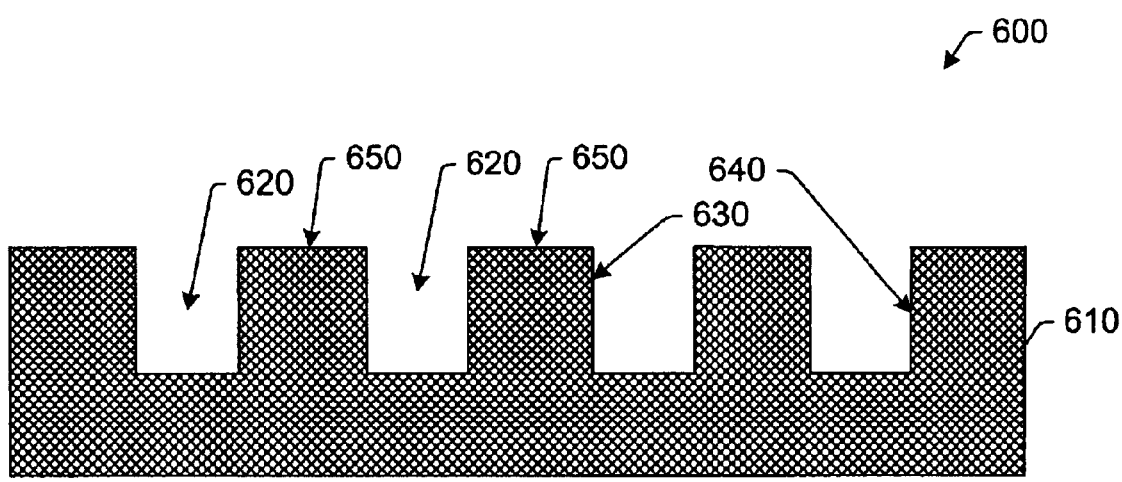
FIG. 6 illustrates a schematic cross-section of a semiconductor structure in accordance with another aspect of the present invention.

FIG. 6 illustrates a cross-sectional view of a structure 600 comprising an etched silicon oxynitride layer 610 in accordance with another aspect of the present invention. As a result of treating the silicon oxynitride layer 610 before 193 nm or lower photoresist processing with a first plasma containing oxygen and nitrogen, exposed portions of the silicon oxynitride layer 610 can be etched through the openings of the patterned photoresist layer 510 (FIG. 5) to form one or more trenches 620 which may exhibit substantially reduced LER on the sides 630, 640 of the trenches 620.

Moreover, since the treatment to the silicon oxynitride layer 610 prior to photoresist deposition mitigates surface interactions between the layer 610 and the photoresist layer during the photoresist processing, the top surface 650 of the silicon oxynitride layer 610 may have a smoother surface which is substantially free of undesirable pits, ridges, roughness, and the like.

Figure 7:
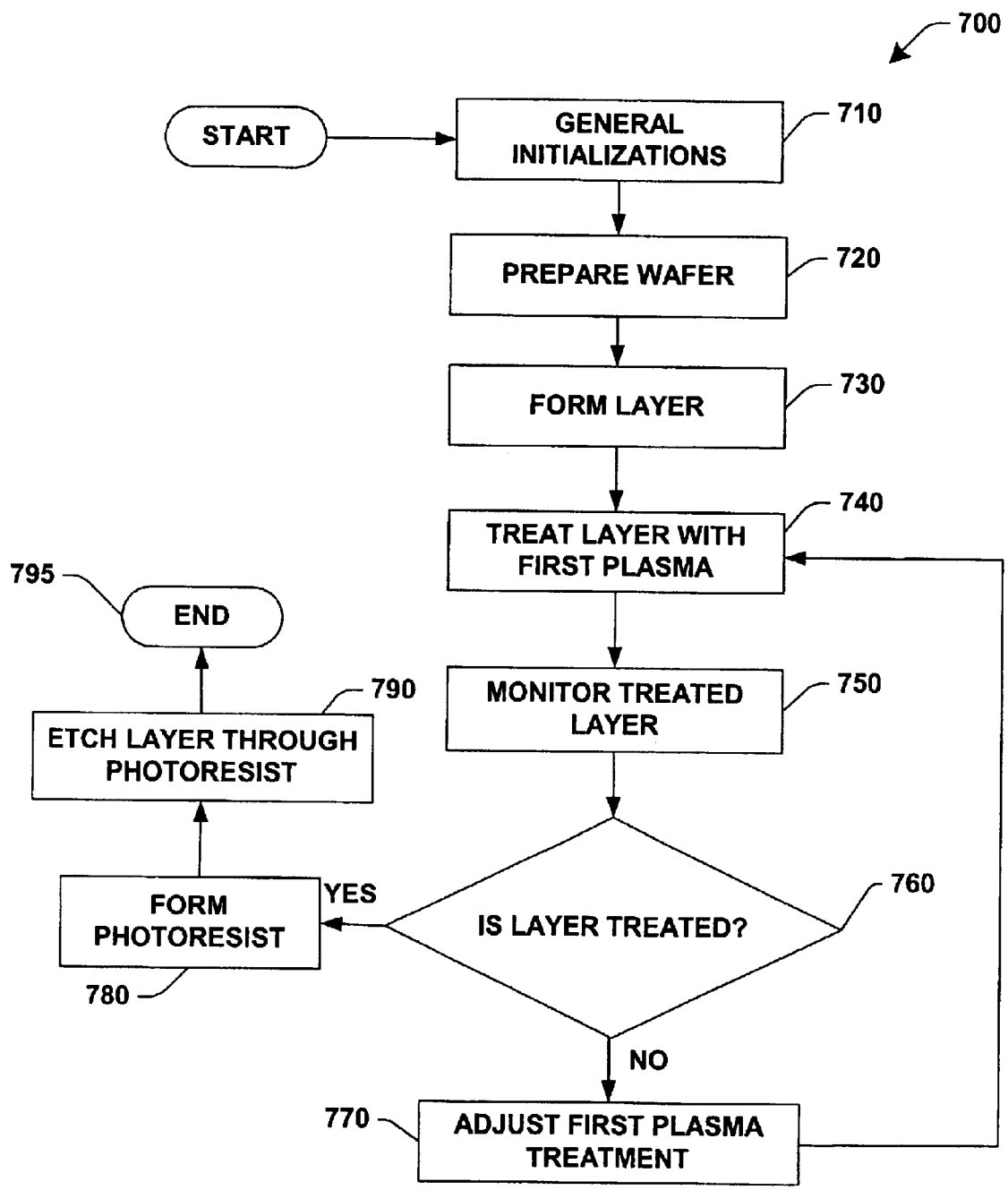
FIG. 7 illustrates a schematic flow diagram of a method for mitigating the occurrence of LER and surface interaction in accordance with one aspect of the present invention.

Turning now to FIG. 7, a flow diagram is shown according to an exemplary method 700 to mitigate surface abnormalities in situ on semiconductor devices. More specifically, the method 700 reduces LER and surface interactions on a photoresist-clad silicon ox)nitride or silicon nitride layer during 193 nm or lower photoresist processing. The method can begin at 710 with general initializations in order to accommodate a desired fabrication process such as a trench formation fabrication process. At 720, a semiconductor wafer is prepared for the fabrication process. The wafer may include a polysilicon crystal substrate having a silicon oxynitride layer formed thereon (at 730).

At 740, the silicon oxynitride layer is exposed to a first plasma treatment containing oxygen and nitrogen. A second plasma treatment containing nitrogen and hydrogen may immediately following the first plasma treatment, depending on the user's desired application. The first plasma is administered under a pressure from about 1050 mTorr to about 1350 mTorr and at a suitable temperature in order to maintain a substrate underlying the layer from about 100° C. to about 300° C. The first plasma may be provided at flow rate from about 1900 sccm to about 2100 sccm of oxygen and from about 95 sccm to about 105 sccm of nitrogen for about 145 to about 155 seconds. Other treatment parameters are also possible in order to modify the layer for protection from undesirable surface abnormalities caused by 193 nm photoresist processing. The exposure to the first plasma is conducted under non-etch process conditions such that the silicon oxynitride layer and any other layer which may be exposed to the first plasma and/or the second plasma is not substantially etched or damaged in any way to compromise performance and overall function of the device.

During and/or after the administering of the first plasma treatment, the layer may be monitored by a monitor processor (at 750). The monitor processor can determine whether the layer has been treated by transmitting a pulse of light and/or sound onto the layer and receiving a reflected pulse response from the layer. Because the treatment alters or hardens the layer material, particularly the surface of the layer material, the reflected pulse responses from a non-treated layer and a treated layer will be measurably different.

If the monitor processor determines at 760 that the layer has not been treated or has not been affected by the treatment, then the monitor processor can communicate adjustments to be made to the first plasma treatment via a plasma treatment complex or directly to the one or more plasma treatment components (770). Following the adjustments, another plasma treatment may be administered to the layer in the previously described manner (back to 740).

However, if the monitor processor determines at 760 that the layer has been treated accordingly, then an ultra-thin photoresist layer having a thickness from about 2,000 angstroms to about 5,000 angstroms can be formed over the layer at 780 in preparation for a subsequent etch process. The photoresist layer is processed (e.g., exposed and developed) using 193 nm or lower wavelength radiation to form a pattern therein, thus exposing portions of the underlying treated layer.

Because the layer was treated with at least the first plasma, surface interactions between the layer and the photoresist are reduced, if not eliminated. Thus, the patterned photoresist is substantially free of LER. At 790, the treated layer may be etched through the openings of the patterned photoresist using conventional etchants. Because the patterned photoresist is substantially free of LER, the one or more images transferred from the photoresist layer to the treated layer may be substantially free of LER. This fabrication etch process ends at 795 and the layer may undergo further processing as desired by the user.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure comprising:
   providing a semiconductor substrate having a layer formed thereon;
   exposing the layer to a first plasma treatment in order to mitigate surface interactions between the layer and a subsequently formed photoresist without substantially etching the layer, the first plasma containing oxygen and nitrogen;
   exposing the layer to a second plasma treatment after the first plasma treatment is substantially completed and before a patterned photoresist layer is formed on the layer, the second plasma treatment comprising nitrogen and hydrogen;
   forming a the patterned photoresist over the treated layer using about 193 nm or less wavelength radiation, the photoresist being substantially free of line-edge roughness; and
   etching the treated layer through one or more openings in the patterned photo resist.

2. The method of claim 1, wherein the layer is one of a virgin silicon oxynitride layer and a virgin silicon nitride layer.

3. The method of claim 1, wherein the patterned photoresist is formed using about 193 nm wavelength radiation.

4. The method of claim 1, wherein the patterned photoresist is formed using about 157 nm wavelength radiation.

5. The method of claim 1, wherein the first plasma is exposed to the layer under a pressure from about 600 mTorr to about 1800 mTorr, at an oxygen flow rate from about 1500 sccm to about 2500 sccm, at a nitrogen flow rate from about 50 sccm to about 150 sccm for about 100 seconds to about 200 seconds.

6. The method of claim 1 further comprising determining whether the layer has been treated for protection against the surface interaction by employing a monitor processor.

7. The method of claim 6, wherein employing a monitor to determine whether the layer has been treated for protection comprises transmitting a pulse onto the layer, receiving a reflected pulse response from the layer and analyzing the reflected pulse response.

8. The method of claim 7, wherein the reflected pulse response indicates one or more signals characteristic of a treated layer.

9. The method of claim 7, wherein the reflected pulse response indicates one or more signals characteristic of a non-treated layer.

10. The method of claim 1 wherein the layer is exposed to the second plasma treatment for about 10 to about 35 seconds and under a pressure of about 600 mTorr to about 1800 mTorr, the second plasma treatment comprising from about 94% to about 98% nitrogen by volume and from about 2% to about 6% hydrogen by volume.

11. The method of claim 1, further comprising a semiconductor substrate underlying the layer, wherein the substrate is maintained at a temperature from about 100° C. to about 300° C.

12. The method of claim 1, wherein the first plasma comprises from about 94% to about 97% oxygen by volume and from about 3% to about 6% nitrogen by volume.

13. A method of processing a semiconductor structure comprising:
   providing a semiconductor substrate having a virgin silicon oxynitride layer formed thereon;
   exposing at least a portion of the silicon oxynitride layer to a first plasma treatment in order to mitigate surface interactions between the silicon oxynitride layer and a subsequently formed photoresist without substantially etching the silicon oxynitride layer, the first plasma containing oxygen and nitrogen;
   determining whether the silicon oxynitride layer has been treated by employing a monitor processor;
   exposing the silicon oxynitride layer to a second plasma treatment after the first plasma treatment is substantially completed and before a patterned photoresist layer is formed on the silicon oxynitride layer, the second plasma treatment comprising nitrogen and hydrogen;
   forming a the patterned photoresist layer over the treated silicon oxynitride layer using about 193 nm or less wavelength radiation, the photoresist layer being substantially free of line-edge roughness; and
   etching the plasma treated silicon oxynitride layer through the patterned photoresist layer to form a semiconductor feature.

14. The method of claim 13, wherein the patterned photoresist layer is formed using 193 nm wavelength radiation.

15. The method of claim 13, wherein the patterned photoresist layer is formed using 157 nm wavelength radiation.

16. The method of claim 13, wherein the first plasma is exposed to the silicon oxynitride layer for about 125 seconds to about 175 seconds under a pressure from about 1000 mTorr to about 1400 mTorr, at an oxygen flow rate from about 1750 sccm to about 2250 sccm, at a nitrogen flow rate from about 75 sccm to about 125 sccm.

17. The method of claim 13, wherein employing a monitor processor to determine whether the silicon oxynitride layer has been treated for protection comprises transmitting a pulse onto the silicon oxynitride layer, receiving a reflected pulse response from the silicon oxynitride layer and analyzing the reflected pulse response.

18. The method of claim 17, wherein the reflected pulse response indicates one or more signals characteristic of a treated silicon oxynitride layer.

19. The method of claim 17, wherein the reflected pulse response indicates one or more signals characteristic of a non-treated silicon oxynitride layer.

20. The method of claim 13, wherein a top surface of the silicon oxynitride layer is exposed to the first plasma treatment, thereby altering the silicon oxynitride surface in order to mitigate surface interaction between the silicon oxynitride layer and a photoresist layer subsequently formed thereon.

21. The method of claim 13, wherein the silicon oxynitride layer is exposed for about 15 seconds to about 30 seconds.

22. The method of claim 21, wherein the second plasma treatment is administered under a pressure from about 600 mTorr to about 1800 mTorr and at a flow rate from about 1800 sccm to about 3000 sccm.

23. A method of processing a semiconductor structure comprising:

provinding a semiconductor substrate having a virgin silicon oxynitride layer formed thereon;

exposing at least a portion of the silicon oxynitride layer to a first plasma treatment in order to mitigate surface interactions between the silicon oxynitride layer and a subsequently formed photoresist without substantially etching the silicon oxynitride layer, the first plasma containing oxygen and nitrogen, the first plasma treatment comprising from about 94% to about 97% oxygen by volume and from about 3% to about 6% nitrogen by volume;

determining whether the silicon oxynitride layer has been treated by employing a monitor processor;

exposing the silicon oxynitride layer to a second plasma treatment after the first plasma treatment is substantially completed and before a patterned photoresist layer is formed on the silicon oxynitride layer, the second plasma treatment comprising nitrogen and hydrogen;

forming the patterned photoresist layer over the treated silicon oxynitride layer using about 193 nm or less wavelength radiation, the photoresist layer being substantially free of line-edge roughness; and etching the plasma treated silicon oxynitride layer through the patterned photoresist layer to form a semiconductor feature.

24. The method of claim 23, wherein the patterned photoresist layer is formed using 157 nm wavelength radiation.

25. The method of claim 23, wherein the first plasma treatment comprises exposing the silicon oxynitride layer to the first plasma for about 125 seconds to about 175 seconds under a pressure from about 1000 mTorr to about 1400 mTorr, at an oxygen flow rate from about 1750 sccm to about 2250 sccm, at a nitrogen flow rate from about 75 sccm to about 125 sccm.

26. The method of claim 23, wherein the second plasma treatment is administered under a pressure from about 600 mTorr to about 1800 mTorr and at a flow rate from about 1800 sccm to about 3000 sccm.

27. The method of claim 23, wherein employing a monitor processor to determine whether the silicon oxynitride layer has been treated for protection comprises transmitting a pulse onto the silicon oxynitride layer, receiving a reflected pulse response from the silicon oxynitride layer and analyzing the reflected pulse response.

28. The method of claim 27, wherein the reflected pulse response indicates one or more signals characteristic of a treated silicon oxynitride layer.

29. The method of claim 27, wherein the reflected pulse response indicates one or more signals characteristic of a non-treated silicon oxynitride layer.

* * * * *